(12) United States Patent
Kim et al.

(10) Patent No.: US 12,245,453 B2
(45) Date of Patent: Mar. 4, 2025

(54) DISPLAY DEVICE

(71) Applicant: Samsung Display Co., Ltd., Yongin-si (KR)

(72) Inventors: Jungi Kim, Hwaseong-si (KR); Jeong Won Kim, Hwaseong-si (KR); Woongsik Kim, Hwaseong-si (KR); Donghwan Bae, Seoul (KR); Jin-Su Byun, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 310 days.

(21) Appl. No.: 17/746,289

(22) Filed: May 17, 2022

(65) Prior Publication Data
US 2023/0074647 A1  Mar. 9, 2023

(30) Foreign Application Priority Data
Sep. 9, 2021 (KR) .................. 10-2021-0120285

(51) Int. Cl.
*H10K 50/844* (2023.01)
*H10K 50/858* (2023.01)

(52) U.S. Cl.
CPC ......... *H10K 50/844* (2023.02); *H10K 50/858* (2023.02)

(58) Field of Classification Search
CPC .... H10K 50/844; H10K 50/858; H10K 59/40; H10K 59/879; H10K 59/873
See application file for complete search history.

(56) References Cited

U.S. PATENT DOCUMENTS

| 8,415,872 B2 | 4/2013 | Choi et al. |
| 11,545,528 B2 | 1/2023 | Byun et al. |

FOREIGN PATENT DOCUMENTS

| KR | 1020150027486 A | 3/2015 |
| KR | 1020200075597 A | 6/2020 |
| KR | 1020200108145 A | 9/2020 |
| KR | 1020210032600 A | 3/2021 |
| KR | 1020210045554 A | 4/2021 |
| KR | 1020210050616 A | 5/2021 |

*Primary Examiner* — Elias Ullah
(74) *Attorney, Agent, or Firm* — CANTOR COLBURN LLP (57) ABSTRACT

A display device includes a substrate including a display area and a non-display area surrounding the display area, a light emitting structure disposed on the substrate in the display area, a thin film encapsulation layer disposed on the light emitting structure, an optical structure including a first refractive pattern and a second refractive pattern, and a partition wall disposed on the substrate in the non-display area and surrounding the second refractive pattern. The first refractive pattern is disposed on the thin film encapsulation layer, and overlaps the light emitting structure. The second refractive pattern covers the first refractive pattern, has a refractive index smaller than a refractive index of the first refractive pattern, and includes an organic material.

20 Claims, 10 Drawing Sheets

DISPLAY DEVICE

This application claims priority to Korean Patent Application No. 10-2021-0120285, filed on Sep. 9, 2021, and all the benefits accruing therefrom under 35 U.S.C. § 119, the content of which in its entirety is herein incorporated by reference.

BACKGROUND

1. Field

Embodiments of the invention relate to a display device. More particularly, embodiments of the invention relate to a display device with improved light output efficiency.

2. Description of the Related Art

With the development of technology, display devices having improved performance with reduced size and weight are being manufactured. Previously, conventional cathode-ray tube ("CRT") televisions have been widely used as display devices with many desired features in terms of performance and price. A display device that overcomes the shortcomings of the CRT television in terms of miniaturization or portability and has advantages in terms of miniaturization, light weight, and low power consumption has been spotlighted. For example, a plasma display device, a liquid crystal display device, an organic light emitting display device, a quantum dot display device, etc. have been spotlighted.

Such a display device may include an optical structure to improve the light output efficiency. When the optical structure is defective, the display quality of the display device may be deteriorated.

SUMMARY

Embodiments of the invention provide a display device with improved reliability.

A display device according to an embodiment includes a substrate including a display area and a non-display area surrounding the display area, a light emitting structure disposed on the substrate in the display area, a thin film encapsulation layer disposed on the light emitting structure, an optical structure disposed on the thin film encapsulation layer and including a first refractive pattern and a second refractive pattern, and a partition wall disposed on the substrate in the non-display area and surrounding the second refractive pattern. In such an embodiment, the first refractive pattern is disposed on the thin film encapsulation layer, and overlaps the light emitting structure, and the second refractive pattern covers the first refractive pattern, has a refractive index smaller than a refractive index of the first refractive pattern, and includes an organic material.

In an embodiment, a distance from an upper surface of the substrate to an upper surface of the partition wall may be greater than or equal to a distance from the upper surface of the substrate to an upper surface of the second refractive pattern.

In an embodiment, a thickness of the partition wall may be greater than or equal to a thickness of an end of the second refractive pattern.

In an embodiment, an upper surface of the second refractive pattern may be flat.

In an embodiment, the partition wall may be in contact with an end of the second refractive pattern.

In an embodiment, the partition wall may have an inverted taper shape.

In an embodiment, the display device may further include a dam disposed between the substrate and the partition wall in the non-display area and surrounding at least a portion of the thin film encapsulation layer.

In an embodiment, the partition wall may overlap the dam.

In an embodiment, the partition wall may include a photoacid generator.

In an embodiment, the display device may further include a first touch electrode disposed on the thin film encapsulation layer, a protective layer disposed on the first touch electrode, and a second touch electrode disposed on the protective layer. In such an embodiment, the partition wall may be disposed on the protective layer.

A display device according to an embodiment includes a substrate including a display area and a non-display area surrounding the display area, a light emitting structure disposed on the substrate in the display area, a thin film encapsulation layer disposed on the light emitting structure, an optical structure disposed on the thin film encapsulation layer and including a first refractive pattern and a second refractive pattern, and a partition wall disposed on the substrate in the non-display area and surrounding the second refractive pattern. In such an embodiment, the first refractive pattern is disposed on the thin film encapsulation layer, an opening is defined through the first refractive pattern to overlap the light emitting structure, and the second refractive pattern is disposed on the first refractive pattern and in the opening, has a refractive index greater than a refractive index of the first refractive pattern, and includes an organic material.

In an embodiment, a distance from an upper surface of the substrate to an upper surface of the partition wall may be greater than or equal to a distance from the upper surface of the substrate to an upper surface of the second refractive pattern.

In an embodiment, a thickness of the partition wall may be greater than or equal to a thickness of an end of the second refractive pattern.

In an embodiment, an upper surface of the second refractive pattern may be flat.

In an embodiment, the partition wall may be in contact with an end of the second refractive pattern.

In an embodiment, the partition wall may have an inverted taper shape.

In an embodiment, the display device may further include a dam disposed between the substrate and the partition wall in the non-display area and surrounding at least a portion of the thin film encapsulation layer.

In an embodiment, the partition wall may overlap the dam.

In an embodiment, the partition wall may include a photoacid generator.

In an embodiment, the display device may further include a first touch electrode disposed on the thin film encapsulation layer, a protective layer disposed on the first touch electrode, and a second touch electrode disposed on the protective layer. In such an embodiment, the partition wall may be disposed on the protective layer.

In embodiments of the invention, the display device includes the partition wall surrounding the optical structure. Accordingly, a process margin for the discharge amount of organic materials, which are discharged in the inkjet process to form the optical structure, may be ensured, such that the overflow phenomenon of the organic materials may not occur, and an unfilled defect of the organic materials may not occur. Thus, the upper surface of the organic materials may be substantially flat, such that diffuse reflection of light incident onto the optical structure, which is formed as the organic materials are cured, may be prevented. In addition, the delamination phenomenon of components disposed on the optical structure may be prevented. Accordingly, the display quality of the display device may be improved.

BRIEF DESCRIPTION OF THE DRAWINGS

The above and other features of the invention will become more apparent by describing in further detail embodiments thereof with reference to the accompanying drawings.

FIGS. 3, 4A to 4E, and 5 to 7 are views illustrating an embodiment of a method of manufacturing the display device 1000 of FIG. 1.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be in detail with reference to the accompanying drawings.

Figure 1:
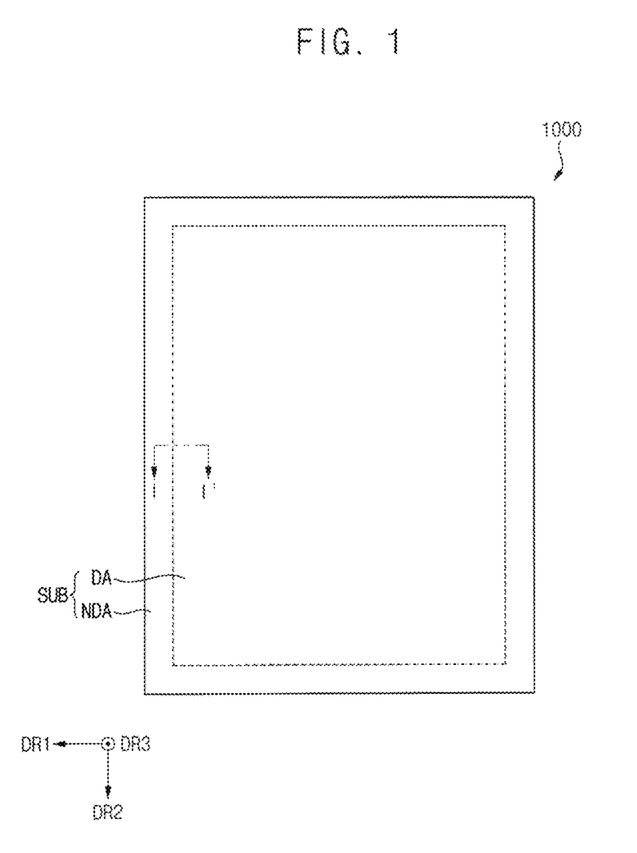
FIG. 1 is a plan view illustrating a display device 1000 according to an embodiment of the disclosure.

FIG. 1 is a plan view illustrating a display device 1000 according to an embodiment of the disclosure.

Referring to FIG. 1, an embodiment of a display device 1000 may include a substrate SUB. The substrate SUB may include a display area DA and a non-display area NDA. The non-display area NDA may surround the display area DA. In an embodiment, for example, the display area DA may have a rectangular shape.

Pixels may be disposed in the display area DA. The pixels may be arranged in the form of a matrix. As the pixel emits light, the display area DA may display an image.

A driver for driving the pixel may be disposed in the non-display area NDA. The driver may provide a signal and/or a voltage to the pixel. In an embodiment, for example, the driver may include a gate driver, a data driver, and the like.

In an embodiment, the display device 1000 may include an organic light emitting display device, a liquid crystal display device, a plasma display device, a quantum dot display device, or the like, for example. Hereinafter, for convenience of description, embodiments where the display device 1000 is the organic light emitting display device will be described in detail, but the disclosure is not limited thereto.

Figure 2:
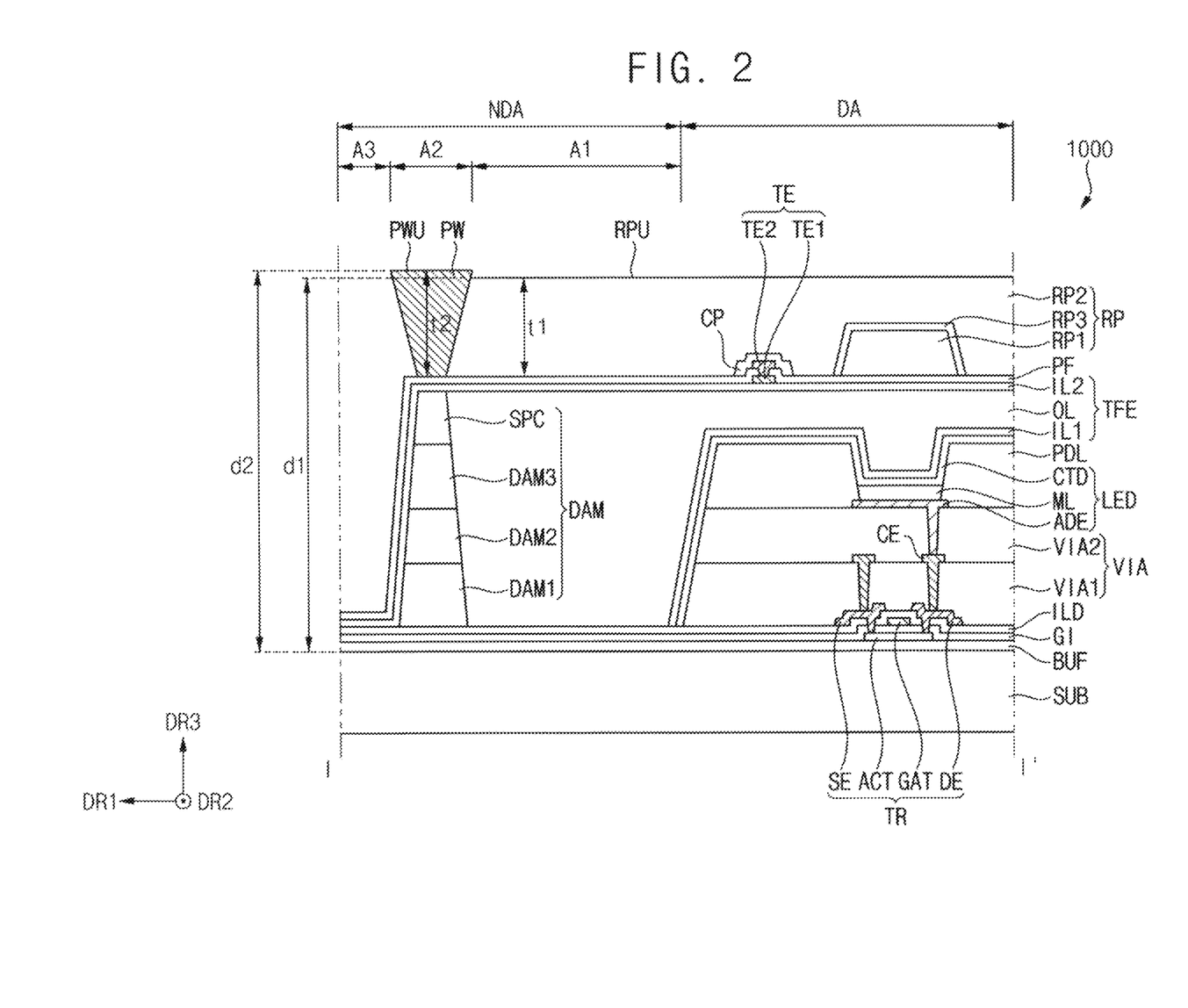
FIG. 2 is a sectional view taken along line I-I' of the display device 1000 of FIG. 1.

FIG. 2 is a sectional view taken along line of the display device 1000 of FIG. 1.

Referring to FIG. 2, an embodiment of the display device 1000 may include a substrate SUB, a buffer layer BUF, a gate insulating layer GI, a driving device TR, an interlayer insulating layer ILD, a via insulating layer VIA, a connection electrode CE, a light emitting structure LED, a pixel defining layer PDL, a thin film encapsulation layer TFE, a dam DAM, a touch electrode TE, a protective layer PF, an optical structure RP, and a partition wall PW.

The substrate SUB may be a flexible substrate including or formed of polyimide or the like. In an embodiment, for example, the flexible substrate may have a stack structure in which polyimide layers and barrier layers are alternately stacked one on another. Alternatively, the substrate SUB may be a rigid substrate including or formed of quartz, synthetic quartz, calcium fluoride, fluorine-doped quartz, soda lime, glass, or alkali-free glass. These elements may be used alone or in combination with each other.

The non-display area NDA may include a first area A1, a second area A2, and a third area A3. The second area A2 may be located outside the display area DA and may be spaced apart from the display area DA. The first area A1 may be positioned between the display area DA and the second area A2. The third area A3 may be located outside the second area A2.

In an embodiment, as shown in FIG. 2, the outside of the display area DA may mean the first direction DR1. In such an embodiment, the second area A2 may be spaced apart from the display area DA in the first direction DR1.

The buffer layer BUF may be disposed on the substrate SUB. The buffer layer BUF may prevent metal atoms or impurities from diffusing from the substrate SUB to an active pattern ACT. The buffer layer BUF may control a heat supply rate during a crystallization process of forming the active pattern ACT. In an embodiment, the buffer layer BUF may include at least one material selected from a silicon oxide, a silicon nitride, a silicon oxynitride, and the like. These elements may be used alone or in combination with each other.

The driving device TR may include the active pattern ACT, a gate electrode GAT, a source electrode SE, and a drain electrode DE.

The active pattern ACT may be disposed on the buffer layer BUF. The active pattern ACT may include a silicon semiconductor or an oxide semiconductor. In an embodiment, for example, the silicon semiconductor may include an amorphous silicon, a polycrystalline silicon, or the like.

The gate insulating layer GI may be disposed on the active pattern ACT to cover the active pattern ACT. The gate insulating layer GI may include an inorganic insulating material. In an embodiment, for example, the inorganic insulating material may include a silicon oxide, a silicon nitride, a silicon oxynitride, or the like. These elements may be used alone or in combination with each other.

The gate electrode GAT may be disposed on the gate insulating layer GI. The gate electrode GAT may overlap the active pattern ACT. The gate electrode GAT may include at least one selected from a metal, a metal oxide, a metal nitride, and the like. In an embodiment, for example, the metal may include silver, molybdenum, aluminum, tungsten, copper, nickel, chromium, titanium, tantalum, platinum, scandium, and the like. These elements may be used alone or in combination with each other. In an embodiment, for example, the metal oxide may include an indium tin oxide ("ITO"), an indium zinc oxide ("IZO"), or the like. These elements may be used alone or in combination with each other. In an embodiment, for example, the metal nitride may include an aluminum nitride, a tungsten nitride, a chromium nitride, or the like. These elements may be used alone or in combination with each other.

The interlayer insulating layer ILD may be disposed on the gate electrode GAT to cover the gate electrode GAT. The interlayer insulating layer ILD may include an inorganic insulating material.

The buffer layer BUF, the gate insulating layer GI, and the interlayer insulating layer ILD may be disposed over the whole area of the display area DA and the non-display area NDA.

The source electrode SE and the drain electrode DE may be disposed on the interlayer insulating layer ILD. Each of the source electrode SE and the drain electrode DE may be connected to the active pattern ACT through a contact hole. Each of the source electrode SE and the drain electrode DE may include at least one selected from a metal, a metal oxide, a metal nitride, and the like.

The via insulating layer VIA may include a first via insulating layer VIA1 and a second via insulating layer VIA2. The via insulating layer VIA may be positioned in the display area DA. The via insulating layer VIA may have a substantially flat upper surface. The via insulating layer VIA may include an organic insulating material. In an embodiment, for example, the organic insulating material may include a photoresist, a polyacrylic resin, polyimide resin or the like. These elements may be used alone or in combination with each other.

The first via insulating layer VIA1 may be disposed on the source electrode SE and the drain electrode DE to cover the source electrode SE and the drain electrode DE.

The connection electrode CE may be disposed on the first via insulating layer VIAL. The connection electrode CE may be connected to the drain electrode DE through a contact hole.

The second via insulating layer VIA2 may be disposed on the connection electrode CE to cover the connection electrode CE.

The light emitting structure LED may include a pixel electrode ADE, an intermediate layer ML, and a common electrode CTD. The light emitting structure LED may be electrically connected to the driving device TR.

The pixel electrode ADE may be disposed on the second via insulating layer VIA2. The pixel electrode ADE may be connected to the connection electrode CE through a contact hole. The pixel electrode ADE may include at least one selected from a metal, a metal oxide, a metal nitride, and the like.

The pixel defining layer PDL may be disposed on the second via insulating layer VIA2. The pixel defining layer PDL may expose the pixel electrode ADE through a pixel opening defined therethrough. The pixel defining layer PDL may cover an end of the pixel electrode ADE. The pixel defining layer PDL may include an organic insulating material.

The intermediate layer ML may be disposed on the pixel electrode ADE. The intermediate layer ML may be disposed in the pixel opening of the pixel defining layer PDL. The intermediate layer ML may include an organic material that emits light having a predetermined color. In an embodiment, for example, the predetermined color may be red, green, or blue. The organic material may emit the light based on a potential difference between the pixel electrode ADE and the common electrode CTD. The intermediate layer ML may include a hole injection layer, a hole transport layer, an emission layer, an electron transport layer, and an electron injection layer.

The common electrode CTD may be disposed on the intermediate layer ML. The common electrode CTD may cover the pixel defining layer PDL. The common electrode CTD may include a transparent conductive material.

In an embodiment, as shown in FIG. 2, the light emitting structure LED included in the display device 1000 includes the pixel electrode ADE, the intermediate layer ML, and the common electrode CTD, but the disclosure is not limited thereto. In an embodiment, for example, the light emitting structure LED may include at least one selected from a micro light emitting diode ("micro-LED"), a nano light emitting diode ("nano-LED"), a quantum dot ("QD"), and a quantum rod ("QR").

The thin film encapsulation layer TFE may include a first inorganic encapsulation layer IL1 an organic encapsulation layer OL, and a second inorganic encapsulation layer IL2. The thin film encapsulation layer TFE may be disposed on the light emitting structure LED. The thin film encapsulation layer TFE may protect the light emitting structure LED from external moisture, heat, impact, and the like.

The first inorganic encapsulation layer IL1 may be disposed on the common electrode CTD. In an embodiment, for example, the inorganic material included in the first inorganic encapsulation layer IL1 may include a silicon oxide, a silicon nitride, a silicon oxynitride, or the like. These elements may be used alone or in combination with each other.

The organic encapsulation layer OL may be disposed on the first inorganic encapsulation layer IL1. In an embodiment, for example, the organic material included in the organic encapsulation layer OL may include a photoresist, a polyacrylic resin, a polyimide resin, an epoxy resin, or an acrylate resin. These elements may be used alone or in combination with each other. The organic encapsulation layer OL may have a thickness relatively greater than a thickness of the first inorganic encapsulation layer IL1 and a thickness of the second inorganic encapsulation layer IL2.

The second inorganic encapsulation layer IL2 may be disposed on the organic encapsulation layer OL.

The dam DAM may include a first dam DAM1, a second dam DAM2, a third dam DAM3, and a spacer SPC. The dam DAM may surround at least a portion of the thin film encapsulation layer TFE. In an embodiment, the dam DAM may surround the organic encapsulation layer OL when viewed in a plan view.

The dam DAM may be located in the second area A2. The dam DAM may be spaced apart from the via insulating layer VIA and the pixel defining layer PDL. In an embodiment where the organic encapsulation layer OL is formed by using an organic material such as a monomer, the dam DAM may prevent the organic material from overflowing in the edge direction of the substrate SUB (that is, the first direction DR1 in FIG. 2).

The first dam DAM1 may be disposed on the interlayer insulating layer ILD. The first dam DAM1 and the first via insulating layer VIA1 may include substantially the same material as each other, and may be formed substantially at the same time as each other through a same process.

The second dam DAM2 may be disposed on the first dam DAM1. The second dam DAM2 and the second via insulating layer VIA2 may include substantially the same material as each other, and may be formed substantially at the same time as each other through a same process.

The third dam DAM3 may be disposed on the second dam DAM2. The third dam DAM3 and the pixel defining layer PDL may include substantially the same material as each other, and may be formed substantially at the same time as each other through a same process.

The spacer SPC may be disposed on the third dam DAM3. When the intermediate layer ML is formed, the spacer SPC may maintain a spacing distance between the mask and the substrate SUB. The spacer SPC may prevent a defect that may occur by being stabbed or torn by the mask.

The second inorganic encapsulation layer IL2 may cover the organic encapsulation layer OL and the dam DAM. The second inorganic encapsulation layer IL2 may be disposed over the whole area of the display area DA and the non-display area NDA.

The touch electrode TE may include a first touch electrode TE1 and a second touch electrode TE2. The touch electrode TE may detect a change in capacitance formed between the first touch electrode TE1 and the second touch electrode TE2. The touch electrode TE may serve as an input device of the display device 1000.

The first touch electrode TE1 may be disposed on the second inorganic encapsulation layer IL2. The first touch electrode TE1 may extend in a second direction DR2 crossing the first direction DR1. The first touch electrode TE1 may include a transparent conductive material.

The protective layer PF may be disposed on the first touch electrode TE1 to cover the second inorganic encapsulation layer IL2. The protective layer PF may be disposed over the whole area of the display area DA and the non-display area NDA. The protective layer PF may include an insulating material.

The second touch electrode TE2 may be disposed on the protective layer PF. The second touch electrode TE2 may overlap the first touch electrode TE1. The second touch electrode TE2 may be connected to the first touch electrode TE1 through a contact hole formed in the protective layer PF. The second touch electrode TE2 may include a transparent conductive material.

A cover pattern CP may be disposed on the second touch electrode TE2 to cover the second touch electrode TE2. The cover pattern CP may prevent corrosion of the second touch electrode TE2.

The optical structure RP may include a first refractive pattern RP1, a second refractive pattern RP2, and a third refractive pattern RP3. However, the disclosure is not limited to the optical structure RP including the third refractive pattern RP3, and alternatively, the optical structure RP may include only the first refractive pattern RP1 and the second refractive pattern RP2.

The optical structure RP may be disposed on the thin film encapsulation layer TFE. The optical structure RP may improve the light output efficiency. In an embodiment, for example, the optical structure RP may output the light, which is emitted from the light emitting structure LED, in the third direction DR3 perpendicular to a plane defined by the first direction DR1 and the second direction DR2 by using a refractive property.

The first refractive pattern RP1 may be disposed on the protective layer PF. The first refractive pattern RP1 may overlap the light emitting structure LED. In an embodiment, for example, the first refractive pattern RP1 may overlap the intermediate layer ML.

The first refractive pattern RP1 may have a normal taper shape. The first refractive pattern RP1 may have a predetermined first refractive index. In an embodiment, for example, the first refractive index may be in a range of about 1.6 to about 1.7. The thickness of the first refractive pattern may be in a range of about 1.5 micrometers to about 3 micrometers. The first refractive pattern RP1 may include an organic material. The first refractive pattern RP1 may be formed through a photolithography process.

The third refractive pattern RP3 may be disposed on the first refractive pattern RP1 to cover the first refractive pattern RP1. In an embodiment, for example, the third refractive pattern RP3 may come into contact with the upper surface and the side surface of the first refractive pattern RP1. The third refractive index RP3 may have a third refractive index greater than the first refractive index. In an embodiment, for example, the third refractive index may be in a range of about 1.65 to about 1.9. The thickness of the third refractive pattern RP3 may be smaller than the thickness of the first refractive pattern RP1. The third refractive pattern RP3 may include an inorganic material.

The second refractive pattern RP2 may be disposed on the first refractive pattern RP1 and the third refractive pattern RP3 to cover the first refractive pattern RP1 and the third refractive pattern RP3. In an embodiment, for example, where the optical structure RP does not include the third refractive pattern RP3, the second refractive pattern RP2 may directly cover the first refractive pattern RP1.

The second refractive pattern RP2 may have a second refractive index smaller than the first refractive index. In an embodiment, for example, the second refractive index may be in a range of about 1.4 to about 1.6. The second refractive pattern RP2 may have a thickness sufficient to compensate for the step difference caused by the first refractive pattern RP1 and the third refractive pattern RP3. The thickness of the second refractive pattern RP2 may be in a range of about 3 micrometers to about 10 micrometers.

In an embodiment, the second refractive pattern RP2 may include an organic material. In an embodiment, for example, the organic material may include a photoresist, a polyacrylic resin, a polyimide resin, an epoxy resin, an acrylate resin, and the like. These elements may be used alone or in combination with each other. In an embodiment, the second refractive pattern RP2 may be formed through an inkjet process. In such an embodiment, the organic material discharged through the inkjet process may cover the first refractive pattern RP1 and then the organic material may be cured to form the second refractive pattern RP2.

The third refractive pattern RP3 may be disposed between the first refractive pattern RP1 and the second refractive pattern RP2. The third refractive pattern RP3 formed of an inorganic material may come into contact with each of the first refractive pattern RP1 and the second refractive pattern RP2. Accordingly, the first refractive pattern RP1 including or formed of the organic material and the second refractive pattern RP2 including or formed of the organic material may not come into contact with each other. That is, the first refractive pattern RP1 and the second refractive pattern RP2 may not be mixed with each other. Accordingly, the chemical resistance of the optical structure RP may be improved.

The partition wall PW may be disposed on the protective layer PF. The partition wall PW may be located in the non-display area NDA. In an embodiment, the partition wall PW may be located in the second area A2. In such an embodiment, the partition wall PW may overlap the dam DAM. In an alternative embodiment, the partition wall PW may be located in the first area A1.

In an embodiment, the partition wall PW may surround the second refractive pattern RP2. In an embodiment, for example, the partition wall PW may be disposed along the dam DAM surrounding the organic encapsulation layer OL when viewed in a plan view. In such an embodiment, the partition wall PW disposed on the dam DAM may surround the second refractive pattern RP2 disposed on the organic encapsulation layer OL when viewed in a plan view.

In an embodiment, the distance d2 from the upper surface of the substrate SUB to the upper surface PWU of the partition wall PW may be greater than or equal to the distance d1 from the upper surface of the substrate SUB to the upper surface RPU of the second refractive pattern RP2. In such an embodiment, the upper surface PWU of the partition wall PW may be higher than the upper surface RPU of the end of the second refractive pattern RP2 (that is, a part of the second refractive pattern RP2 in the first area A1).

In an embodiment, the thickness t2 of the partition wall PW may be greater than or equal to the thickness t1 of the end of the second refractive pattern RP2.

In a portion adjacent to the partition wall PW, the second refractive pattern RP2 may have a uniform thickness t1. In an embodiment, for example, in a portion where the protective layer PF and the second refractive pattern RP2 directly come into contact with (or are in direct contact with) each other, the second refractive pattern RP2 may have a uniform thickness. In such an embodiment, when the second refractive pattern RP2 is formed by using the organic material discharged in the inkjet process, the partition wall PW may prevent the organic material from overflowing in the edge direction (that is, the first direction DR1) of the substrate SUB (hereinafter overflow phenomenon). In such an embodiment, when the partition wall PW is positioned in the second area A2, the second refractive pattern RP2 may be positioned only in the display area DA and the first area A1. In such an embodiment, the second refractive pattern RP2 may not be located in the second area A2 and the third area A3.

In an embodiment, the partition wall PW may have an inverted taper shape. The partition wall PW having the inverted taper shape may effectively prevent the overflow phenomenon of the organic material.

In an embodiment, the upper surface of the second refractive pattern RP2 may be substantially flat. The substantially flat may mean that the upper surface is exactly flat or flat within an acceptable deformation (for example, a deformation that may occur due to a manufacturing process). In such an embodiment, the second refractive pattern RP2 may not protrude in the third direction DR3.

In an embodiment, the partition wall PW may come into contact with the end of the second refractive pattern RP2. In such an embodiment, the second refractive pattern RP2 may come into contact with the partition wall PW while having the substantially flat upper surface.

In an embodiment, the partition wall PW may include a photoacid generator (PAG). In an embodiment, for example, the partition wall PW may include at least one selected from the photoacid generator, a binder resin, an additive, and the like. The photoacid generator may include a negative photosensitive material that is cured in a portion irradiated with light.

FIGS. 3, 4A to 4E, and 5 to 7 are views illustrating an embodiment of a method of manufacturing the display device 1000 of FIG. 1. FIGS. 4A to 4E are views illustrating an embodiment of a method of manufacturing the partition wall PW included in the display device 1000.

Figure 3:
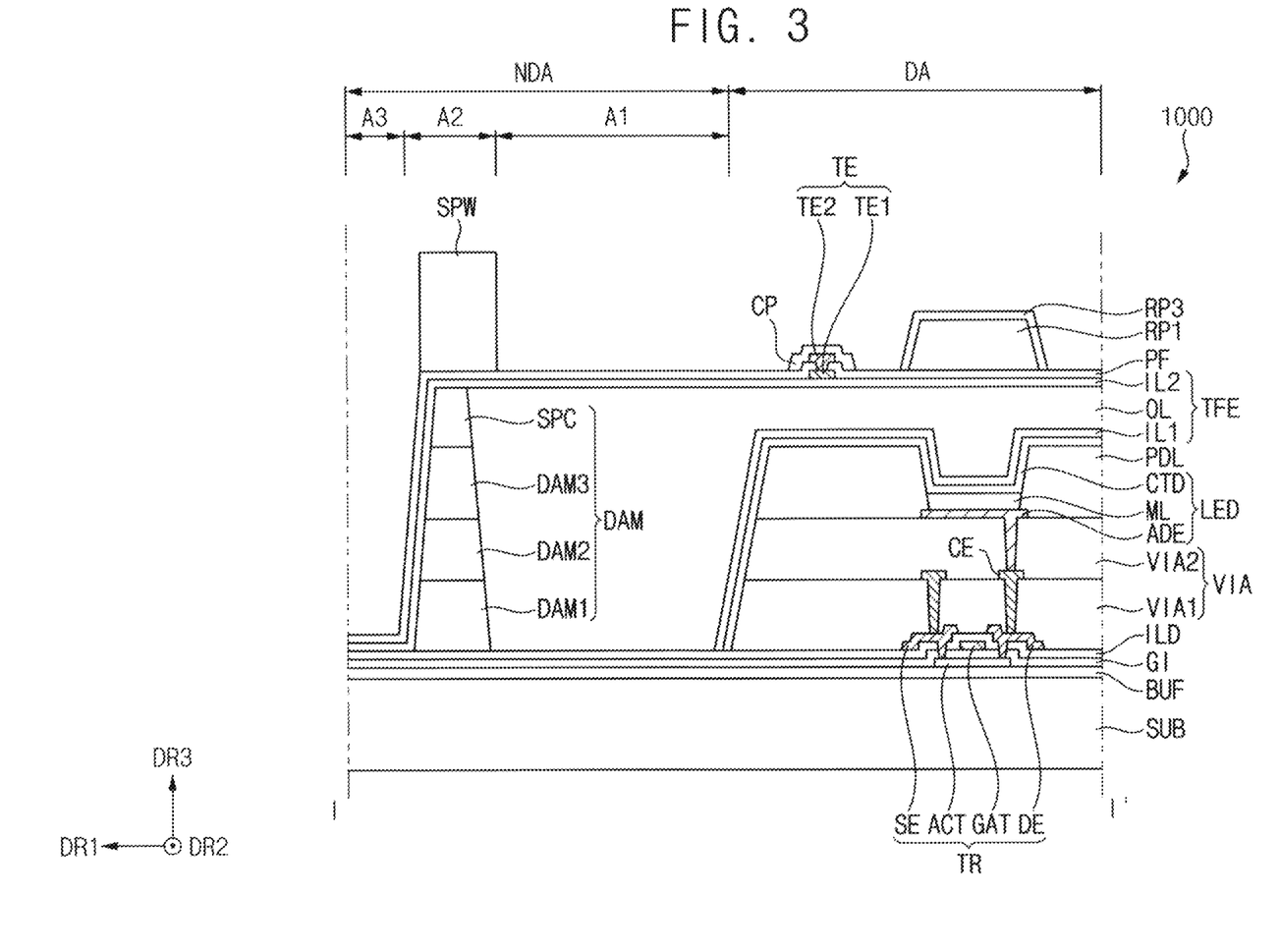

Referring to FIG. 3, the driving device TR may be formed (or provided) on the substrate SUB. The light emitting structure LED may be formed on the driving device TR. The thin film encapsulation layer TFE may be formed on the light emitting structure LED. The touch electrode TE and the protective layer PF may be formed on the thin film encapsulation layer TFE.

The first refractive pattern RP1 may be formed on the protective layer PF through a photolithography process. The third refractive pattern RP3 may be formed on the first refractive pattern RP1. A preliminary partition wall SPW may be formed on the protective layer PF. However, the preliminary partition wall SPW is not limited as to be formed after the first refractive pattern RP1 and the third refractive pattern RP3 are formed. Alternatively, the preliminary partition wall SPW may be formed before the first refractive pattern RP1 is formed or before the third refractive pattern RP3 is formed.

Figure 4A:
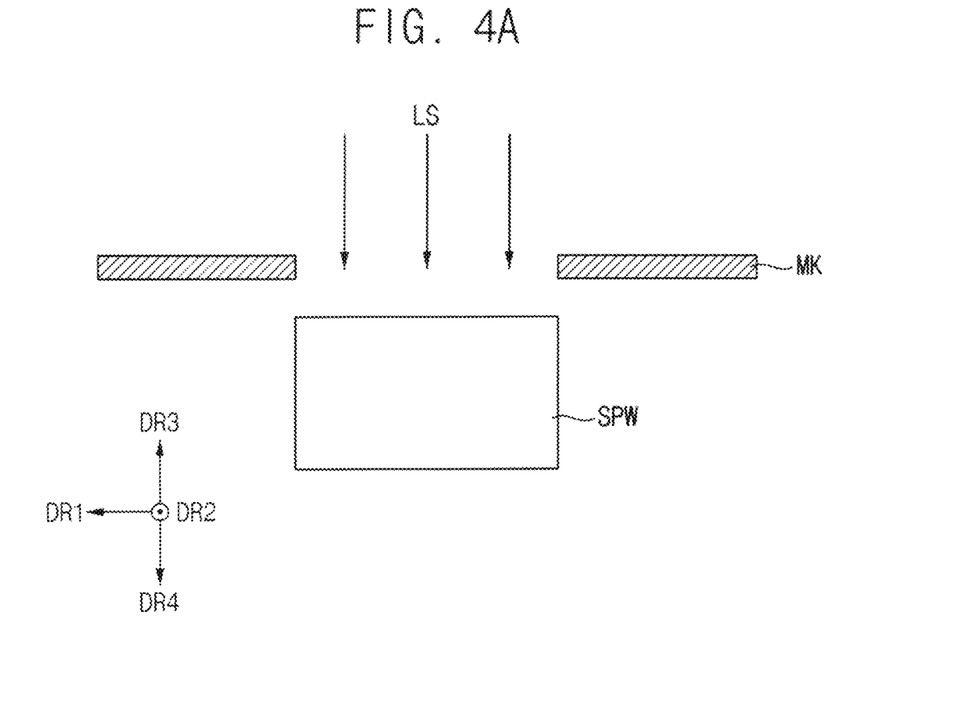
FIGS. 4A to 4E are views illustrating an embodiment of a method of manufacturing the partition wall PW included in the display device 1000.

Referring to FIG. 4A, light LS may be radiated to the preliminary partition wall SPW through a photomask MK. The light LS may be radiated in a fourth direction DR4 opposite to the third direction DR3.

Figure 4B:
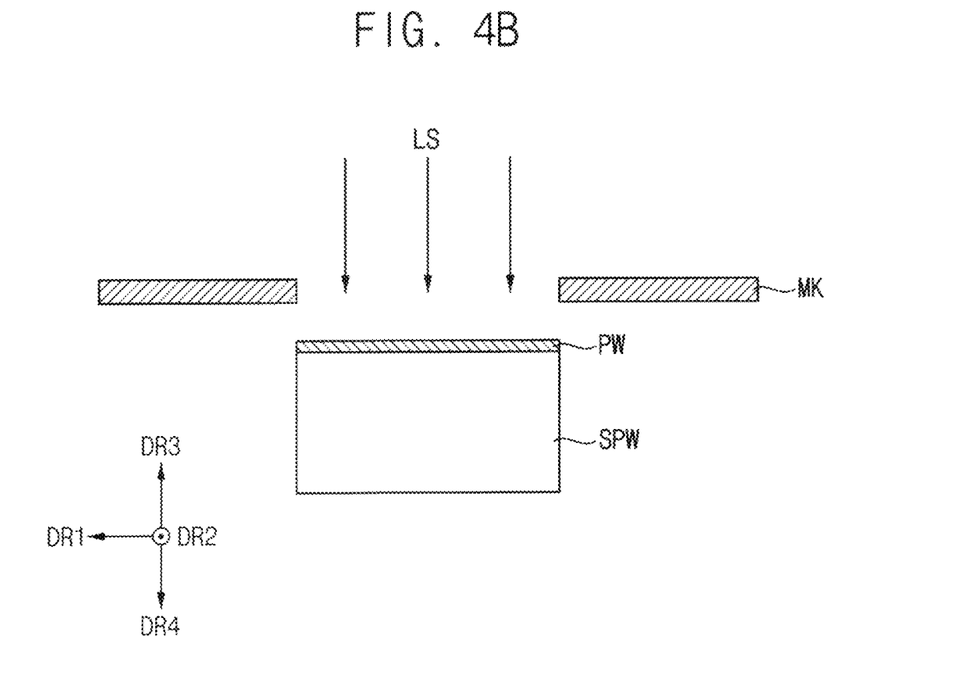

Referring to FIG. 4B, since the partition wall PW includes the photoacid generator that is a negative photosensitive material, the surface of the preliminary partition wall SPW irradiated with the light LS may be cured. The cured surface of the preliminary partition wall SPW may be converted into the partition wall PW.

Figure 4C:
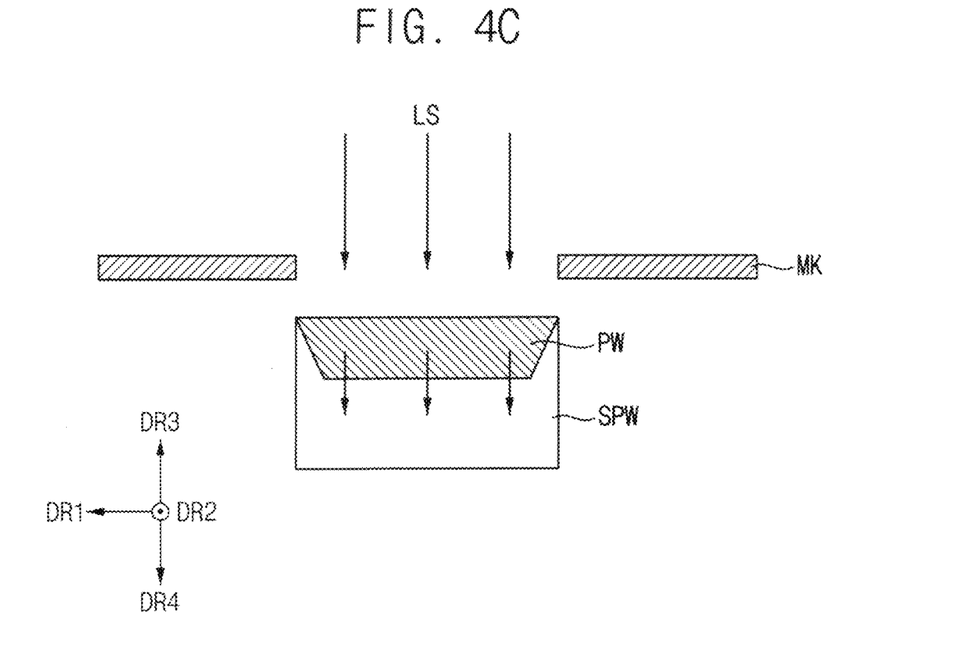

Referring to FIG. 4C, the amount of light LS may decrease as it travels in the fourth direction DR4. That is, the amount of the preliminary partition wall SPW that is converted into the partition wall PW may be reduced as being in the fourth direction DR4.

Figure 4D:
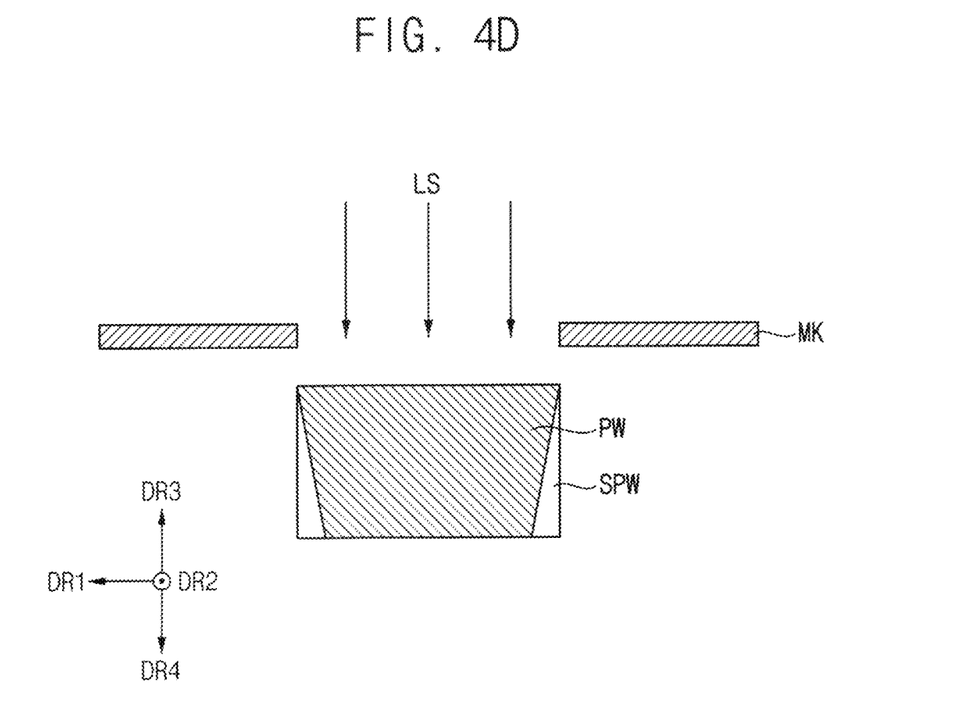
Figure 4E:
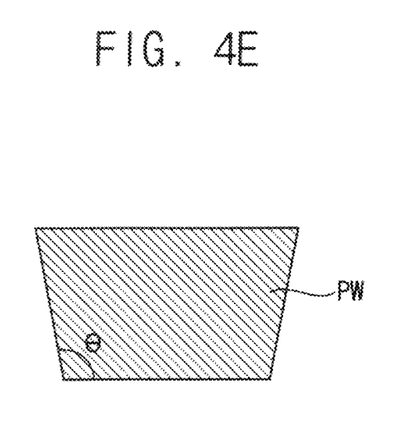

Referring to FIGS. 4D and 4E, the non-cured preliminary partition wall SPW may be removed through a developing process. Accordingly, the partition wall PW having an inverted taper shape may be formed. In an embodiment, the inverse taper angle θ of the partition wall PW may be in a range of about 100 degrees to about 130 degrees.

Figure 5:
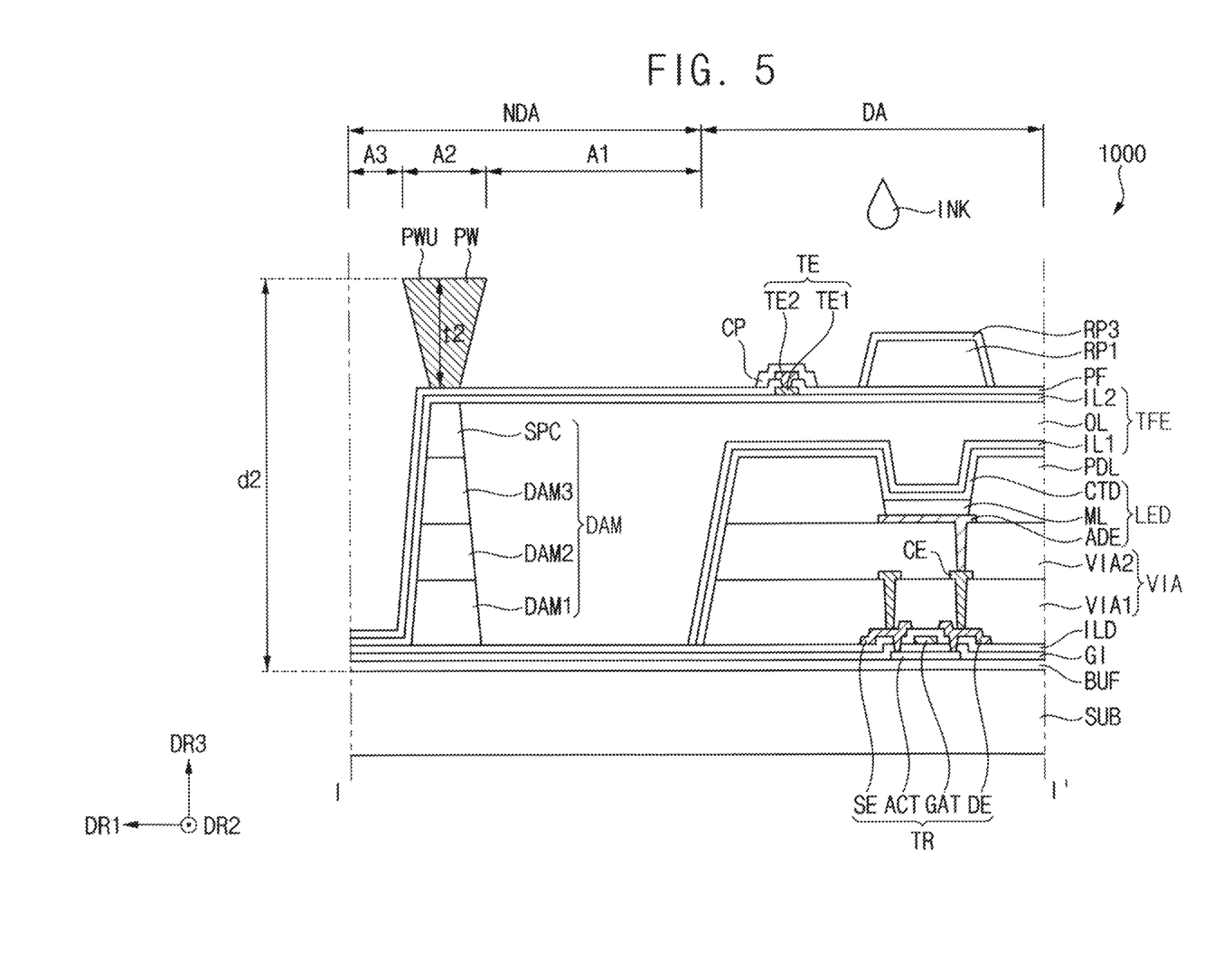

Referring to FIG. 5, the organic material INK forming the second refractive pattern RP2 may be discharged through the inkjet process. The organic material INK may be sufficiently discharged to cover the first refractive pattern RP1, the third refractive pattern RP3, and the cover pattern CP.

Figure 6:
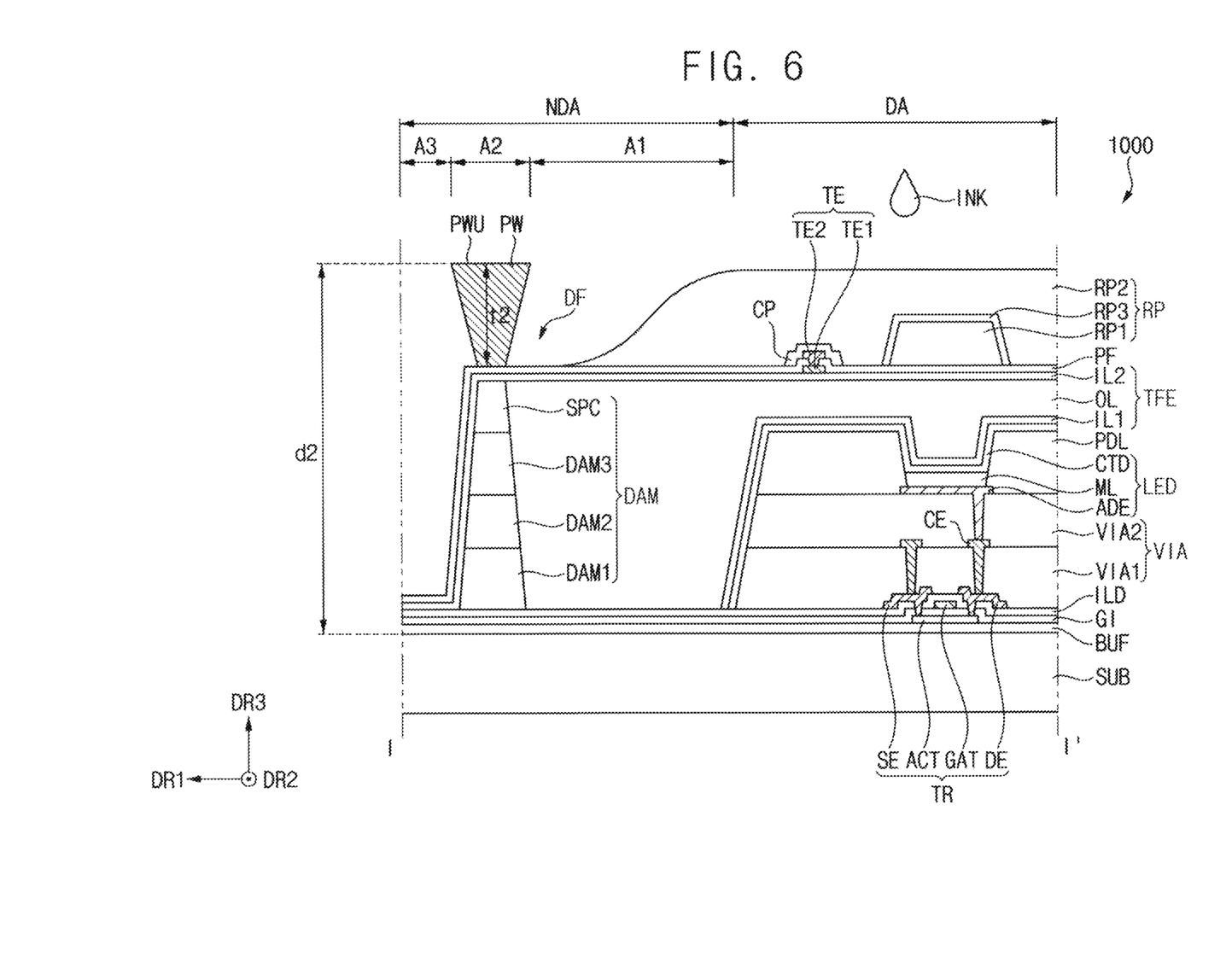

Referring to FIG. 6, the discharged organic material INK may flow from the display area DA to the first area A1. When an end DF of the second refractive pattern RP2 does not come into contact with the partition wall PW, the thickness of the second refractive pattern RP2 may decrease in the first direction DR1. A case in which the end of the second refractive pattern RP2 does not come into contact with the partition wall PW may be referred to as an unfilled defect. Therefore, a sufficient amount of the organic material INK may be discharged so that the second refractive pattern RP2 may come into contact with the partition wall PW.

Figure 7:
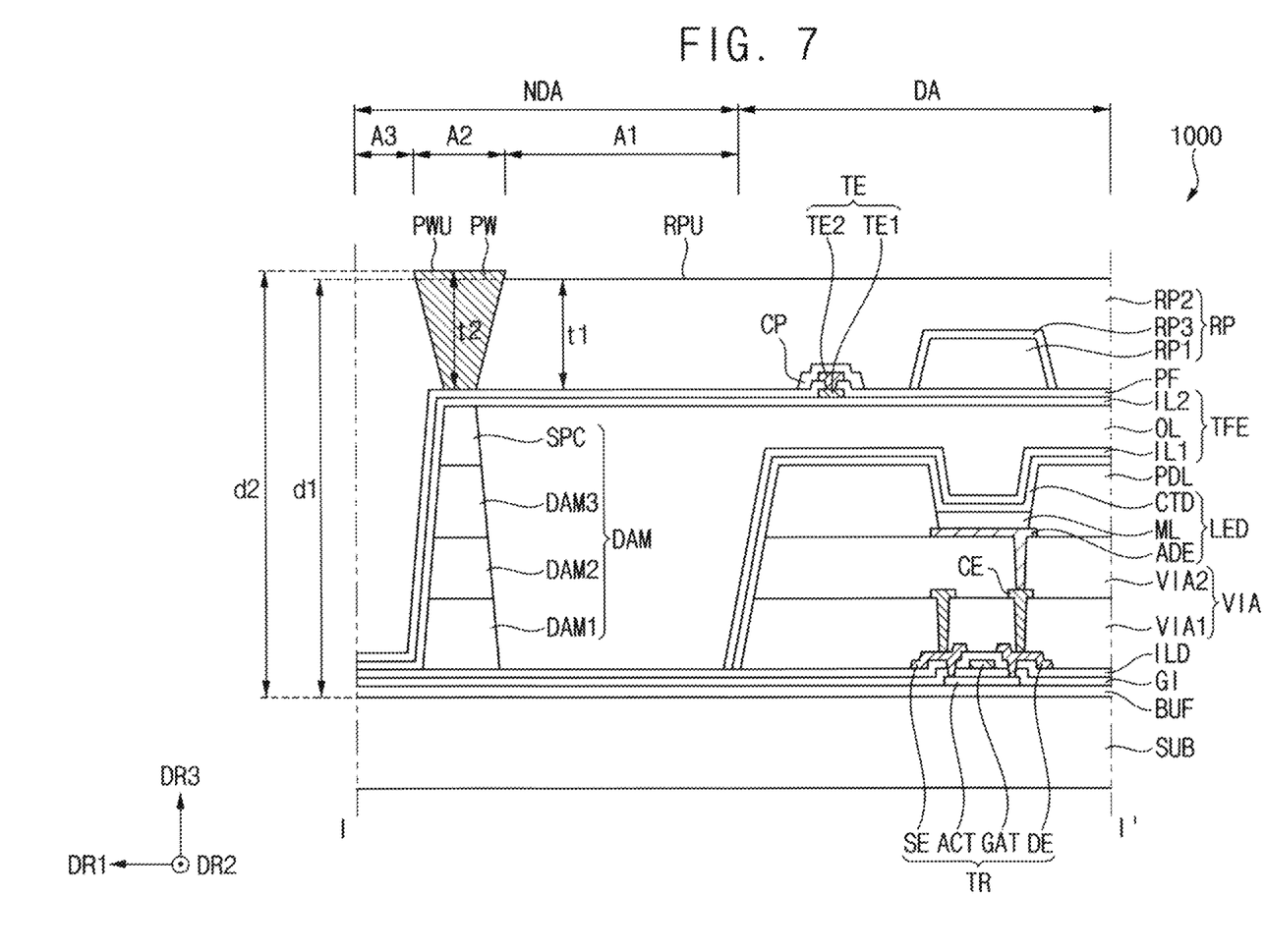

Referring to FIG. 7, the organic material INK may be discharged until the thickness t1 of the end of the second refractive pattern RP2 becomes less than or equal to the thickness t2 of the partition wall PW. The partition wall PW having an inverted taper shape may prevent the overflow phenomenon of the organic material INK. That is, the partition wall PW may prevent the second refractive pattern RP2 from overflowing into the second area A2 and the third area A3.

In an embodiment, the partition wall PW may prevent the overflow phenomenon and the unfilled defect of the organic material INK, so that the upper surface RPU of the second refractive pattern RP2 may become flat. In an embodiment, the second refractive pattern RP2 may be located only in the display area DA and the first area A1 and may come into contact with the partition wall PW, and the upper surface RPU of the second refractive pattern RP2 may be positioned lower than the upper surface PWU of the partition wall PW and may be substantially flat. Accordingly, the diffuse reflection of light incident onto the upper surface RPU of the second refractive pattern RP2 may be prevented. In such an embodiment, the delamination phenomenon of a component (for example, a polarization layer) disposed on the second refractive pattern RP2 may be prevented. Accordingly, the display quality of the display device 1000 may be improved.

Figure 8:
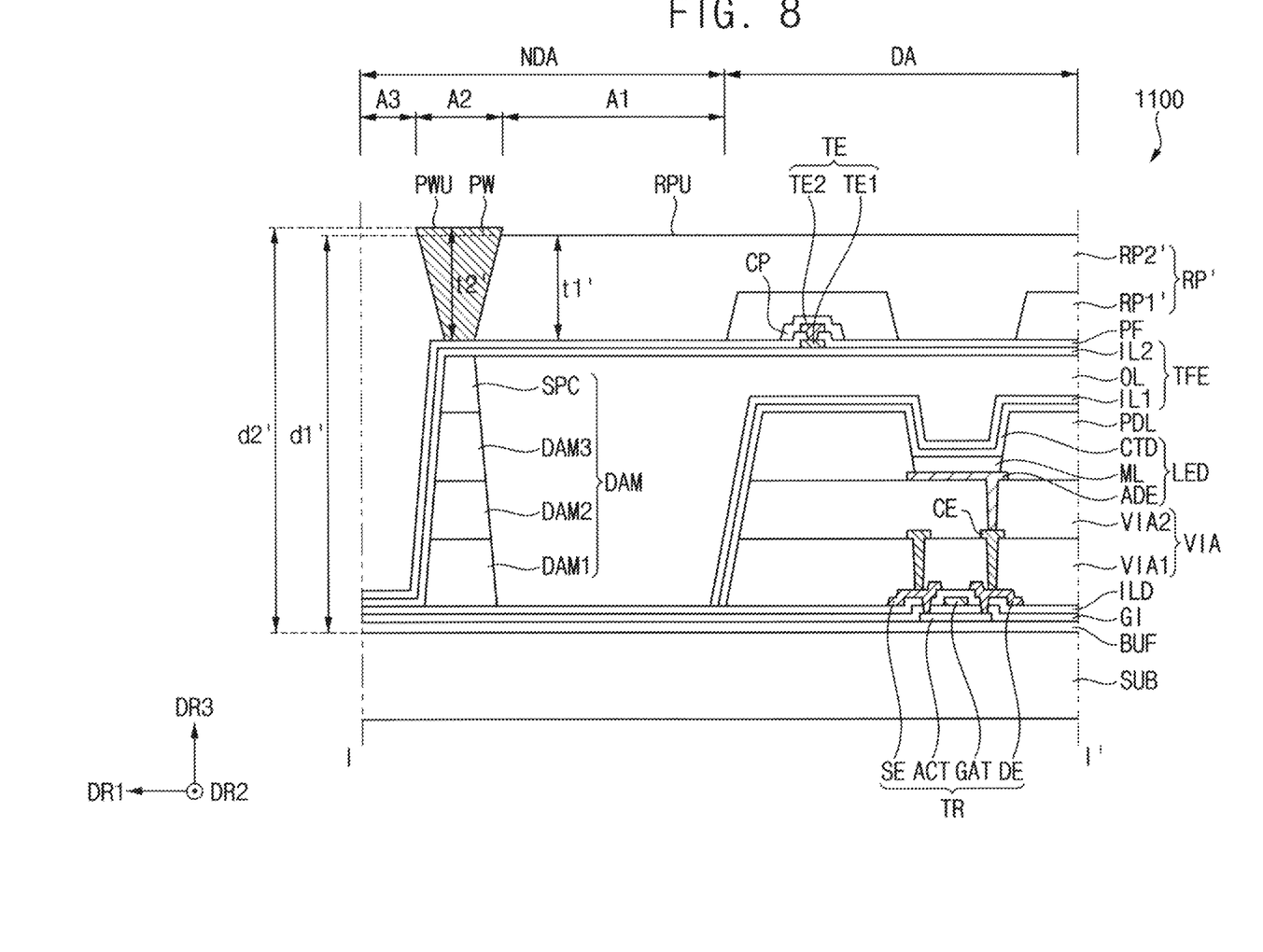
FIG. 8 is a sectional view taken along line I-I' of a display device 1100 according to an alternative embodiment.

FIG. 8 is a sectional view taken along line I-I' of a display device 1100 according to an alternative embodiment. The display device 1100 shown in FIG. 8 may be substantially the same as the display device 1000 described above with reference to FIG. 1, except for the optical structure RP'. Accordingly, any repetitive detailed descriptions of the same or like elements will be omitted.

Referring to FIG. 8, an embodiment of the display device 1100 may include a substrate SUB, a buffer layer BUF, a gate insulating layer GI, a driving device TR, an interlayer insulating layer ILD, a via insulating layer VIA, a connection electrode CE, a light emitting structure LED, a pixel defining layer PDL, a thin film encapsulation layer TFE, a dam DAM, a touch electrode TE, a protective layer PF, an optical structure RP', and a partition wall PW.

The optical structure RP' may include a first refractive pattern RP1' and a second refractive pattern RP2'. The optical structure RP' may improve the light output efficiency. In an embodiment, for example, the optical structure RP may output the light, which is emitted from the light emitting structure LED, in the third direction DR3 using total reflection characteristics.

The first refractive pattern RP1' may be disposed on the thin film encapsulation layer TFE. The first refractive pattern RP1' may be located in the display area DA. In an embodiment, an opening is defined through the first refractive pattern RP1' to overlap the light emitting structure LED. The first refractive pattern RP1' may have a predetermined fourth refractive index. In an embodiment, for example, the fourth refractive index may be in a range of about 1.5 to about 1.6. The first refractive pattern RP1' may include an organic material and may be formed through a photolithography process.

The second refractive pattern RP2' may be disposed on the first refractive pattern RP1'. The second refractive pattern RP2' may fill the opening of the first refractive pattern RP1' and cover the first refractive pattern RP1'. The second refractive pattern RP2' may have a fifth refractive index greater than the fourth refractive index. In an embodiment, for example, the fifth refractive index may be in a range of about 1.6 to about 1.7. The second refractive pattern RP2' may include an organic material and may be formed through an inkjet process.

In an embodiment, the thickness t2' of the partition wall PW may be greater than or equal to the thickness t1' of the end of the second refractive pattern RP2'.

In an embodiment, the distance d2' from the upper surface of the substrate SUB to the upper surface PWU of the partition wall PW may be greater than or equal to the distance d1' from the upper surface of the substrate SUB to the upper surface RPU of the second refractive pattern RP2'.

The partition wall PW included in the display device 1100 according to an alternative embodiment of the disclosure may prevent the overflow phenomenon and unfilled defect of the organic material that forms the second refractive pattern RP2'. In such an embodiment, the second refractive pattern RP2' may be located only in the display area DA and the first area A1 and may come into contact with the partition wall PW, and the upper surface RPU of the second refractive pattern RP2' may be positioned lower than the upper surface PWU of the partition wall PW and may become substantially flat. Accordingly, the diffuse reflection of light incident onto the upper surface RPU of the second refractive pattern RP2' may be prevented. In such an embodiment, the delamination phenomenon of a component (for example, a polarization layer) disposed on the second refractive pattern RP2' may be prevented. Accordingly, the display quality of the display device 1100 may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate including a display area and a non-display area surrounding the display area;
   a light emitting structure disposed on the substrate in the display area;
   a thin film encapsulation layer disposed on the light emitting structure;
   an optical structure disposed on the thin film encapsulation layer, wherein the optical structure includes:
      a first refractive pattern disposed on the thin film encapsulation layer and overlapping the light emitting structure; and
      a second refractive pattern covering the first refractive pattern, having a refractive index smaller than a refractive index of the first refractive pattern, and including an organic material; and
   a partition wall disposed on the substrate in the non-display area and surrounding the second refractive pattern.

2. The display device of claim 1, wherein a distance from an upper surface of the substrate to an upper surface of the partition wall is greater than or equal to a distance from the upper surface of the substrate to an upper surface of the second refractive pattern.

3. The display device of claim 1, wherein a thickness of the partition wall is greater than or equal to a thickness of an end of the second refractive pattern.

4. The display device of claim 1, wherein an upper surface of the second refractive pattern is flat.

5. The display device of claim 1, wherein the partition wall is in contact with an end of the second refractive pattern.

6. The display device of claim 1, wherein the partition wall has an inverted taper shape.

7. The display device of claim 1, further comprising:
   a dam disposed between the substrate and the partition wall in the non-display area and surrounding at least a portion of the thin film encapsulation layer.

8. The display device of claim 7, wherein the partition wall overlaps the dam.

9. The display device of claim 1, wherein the partition wall includes a photoacid generator.

10. The display device of claim 1, further comprising:
    a first touch electrode disposed on the thin film encapsulation layer;
    a protective layer disposed on the first touch electrode; and
    a second touch electrode disposed on the protective layer, wherein the partition wall is disposed on the protective layer.

11. A display device comprising:
    a substrate including a display area and a non-display area surrounding the display area;
    a light emitting structure disposed on the substrate in the display area;
    a thin film encapsulation layer disposed on the light emitting structure;
    an optical structure disposed on the thin film encapsulation layer, wherein the optical structure includes:
       a first refractive pattern disposed on the thin film encapsulation layer, wherein an opening is defined through the first refractive pattern to overlap the light emitting structure; and
       a second refractive pattern disposed on the first refractive pattern and in the opening, having a refractive index greater than a refractive index of the first refractive pattern, and including an organic material; and
    a partition wall disposed on the substrate in the non-display area and surrounding the second refractive pattern.

12. The display device of claim 11, wherein a distance from an upper surface of the substrate to an upper surface of the partition wall is greater than or equal to a distance from the upper surface of the substrate to an upper surface of the second refractive pattern.

13. The display device of claim 11, wherein a thickness of the partition wall is greater than or equal to a thickness of an end of the second refractive pattern.

14. The display device of claim 11, wherein an upper surface of the second refractive pattern is flat.

15. The display device of claim 11, wherein the partition wall is in contact with an end of the second refractive pattern.

16. The display device of claim 11, wherein the partition wall has an inverted taper shape.

17. The display device of claim 11, further comprising:
    a dam disposed between the substrate and the partition wall in the non-display area and surrounding at least a portion of the thin film encapsulation layer.

18. The display device of claim 17, wherein the partition wall overlaps the dam.

19. The display device of claim 11, wherein the partition wall includes a photoacid generator.

20. The display device of claim 11, further comprising:
    a first touch electrode disposed on the thin film encapsulation layer;
    a protective layer disposed on the first touch electrode; and a second touch electrode disposed on the protective layer,
wherein the partition wall is disposed on the protective layer.

\* \* \* \* \*